(12) United States Patent
Tong

(10) Patent No.: US 7,225,306 B2
(45) Date of Patent: May 29, 2007

(54) EFFICIENT ADDRESS GENERATION FOR FORNEY'S MODULAR PERIODIC INTERLEAVERS

(75) Inventor: Po Tong, Los Altos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 344 days.

(21) Appl. No.: 10/970,182

(22) Filed: Oct. 21, 2004

(65) Prior Publication Data

US 2005/0289431 A1 Dec. 29, 2005

Related U.S. Application Data

(60) Provisional application No. 60/582,740, filed on Jun. 23, 2004.

(51) Int. Cl.
*G06F 12/00* (2006.01)

(52) U.S. Cl. .................... 711/157; 711/5; 711/100; 711/150; 711/151; 711/157; 711/173; 365/230.01; 365/230.03; 365/189.01; 365/189.02; 365/189.04

(58) Field of Classification Search .................. 711/5
See application file for complete search history.

(56) References Cited

U.S. PATENT DOCUMENTS

| | | | | |
|---|---|---|---|---|
| 4,559,625 A | * | 12/1985 | Berlekamp et al. | 714/701 |
| 5,469,851 A | * | 11/1995 | Lipschutz | 600/447 |
| 5,579,277 A | * | 11/1996 | Kelly | 365/230.02 |
| 5,764,649 A | | 6/1998 | Tong | |
| 6,701,419 B2 | * | 3/2004 | Tomaiuolo et al. | 711/157 |
| 2001/0042178 A1 | * | 11/2001 | Achilles et al. | 711/150 |
| 2002/0029362 A1 | * | 3/2002 | Stephen et al. | 714/752 |

FOREIGN PATENT DOCUMENTS

EP 0681373 A2 11/1995

OTHER PUBLICATIONS

Forney, G. D., "Burst-Correcting Codes for the Classic Bursty Channel," *IEEE Transactions on Communication Technology*, IEEE Inc. New York, US, vol.19, No. 5, Oct. 1, 1971, pp. 772-781.
Ramsey, J. L., "Realization of Optimum Interleavers," *IEEE Transactions on Information Theory*, IEEE Inc. New York, US, vol. 16, No. 3, May 1, 1970, pp. 338-345.

* cited by examiner

*Primary Examiner*—Sanjiv Shah
*Assistant Examiner*—Zhuo H. Li
(74) *Attorney, Agent, or Firm*—Steven A. Shaw; W. James Brady; Frederick J. Telecky, Jr.

(57) ABSTRACT

An efficient way to generate the address sequence for the RAM implementation of Forney's (P, D, m) interleavers requires only A+1+2P memory locations, which is close to the theoretical minimum. Here A is the average delay of the symbols through the interleaver. The address generation circuit (with simple adders and registers) works for variable P,D,m. This is achieved by decomposing the (P,D,m) interleaver into a concatenation of a multiplexed interleaver (implemented with A+1 memory locations), followed by a block interleaver (implemented with 2P memory locations). In many applications, these 2P memory locations can be treated as part of the memory for controlling the data flow of the system.

11 Claims, 11 Drawing Sheets

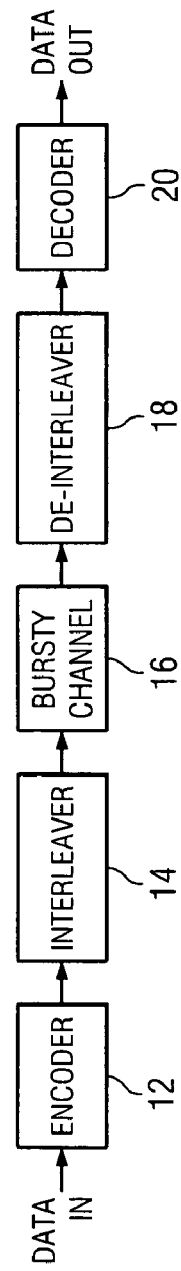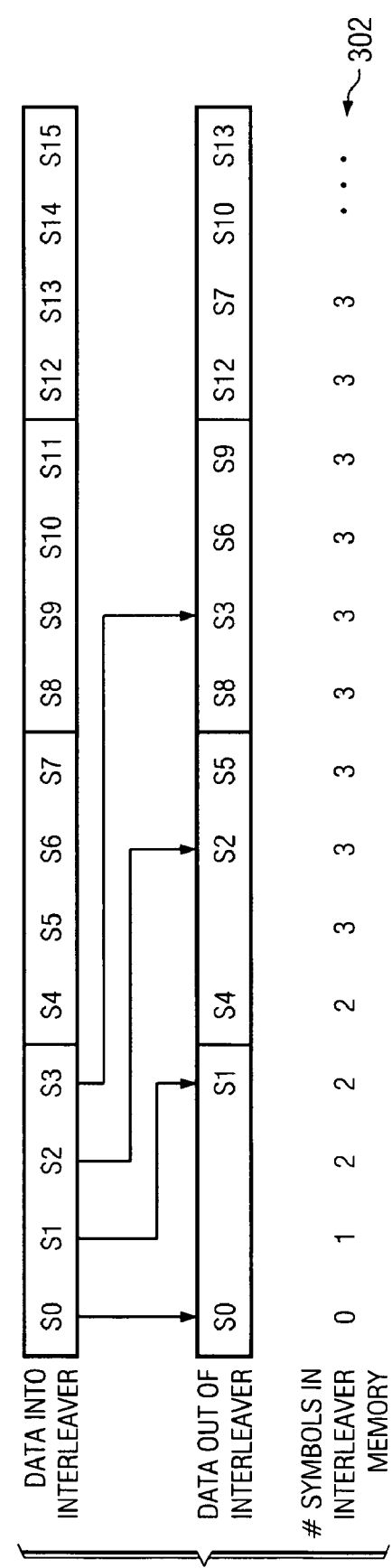

| SYMBOL | 0 | 1 | 2 | 3 |
|---|---|---|---|---|
| DELAY | 0 | 2 | 4 | 6 |
| ADDRESS (2-DIM) | * | 0 | 2 | 0 |
| | * | 1 | 2 | 1 |
| | * | 0 | 2 | 0 |
| | * | 1 | 2 | 1 |
| | ⋮ | ⋮ | ⋮ | ⋮ |
| SUBSEQUENCE PERIOD | 1 | 2 | 1 | 2 |

500

| SYMBOL | 0 | 1 | 2 | 3 | 0 | 1 | 2 | 3 | 0 | 1 | 2 | 3 | 0 | 1 | 2 | 3 | ... |
|---|---|---|---|---|---|---|---|---|---|---|---|---|---|---|---|---|---|
| DELAY | 0 | 2 | 4 | 6 | 0 | 2 | 4 | 6 | 0 | 2 | 4 | 6 | 0 | 2 | 4 | 6 | ... |
| ADDRESS | * | | | | * | | | | * | | | | * | | | | ... |

| SYMBOL | 0 | 1 | 2 | 3 | 0 | 1 | 2 | 3 | 0 | 1 | 2 | 3 | 0 | 1 | 2 | 3 | ... |
|---|---|---|---|---|---|---|---|---|---|---|---|---|---|---|---|---|---|
| DELAY | 0 | 2 | 4 | 6 | 0 | 2 | 4 | 6 | 0 | 2 | 4 | 6 | 0 | 2 | 4 | 6 | ... |
| ADDRESS | * | 0 | 2 | 0 | * | 1 | 2 | 1 | * | 0 | 2 | 0 | * | 1 | 2 | 1 | ... |

FIG. 9

| SYMBOL i | 0 | 1 | 2 | 3 | 4 | 5 | 6 | 7 | 8 | 9 | 10 | 11 | 12 |
|---|---|---|---|---|---|---|---|---|---|---|---|---|---|
| DELAY f(i) | 0 | 4 | 8 | 12 | 16 | 20 | 24 | 28 | 32 | 36 | 40 | 44 | 48 |
| i+f(i) | 0 | 5 | 10 | 15 | 20 | 25 | 30 | 35 | 40 | 45 | 50 | 55 | 60 |
| q(i) | 0 | 0 | 0 | 1 | 1 | 1 | 2 | 2 | 3 | 3 | 3 | 4 | 4 |
| r(i) | 0 | 5 | 10 | 2 | 7 | 12 | 4 | 9 | 1 | 6 | 11 | 3 | 8 |
| ADDRESS (2-DIM) | * | | | | | | | | | | | | |
| | * | | | | | | | | | | | | |
| | * | | | | | | | | | | | | |
| | * | | | | | | | | | | | | |
| | * | | | | | | | | | | | | |
| | * | | | | | | | | | | | | |
| | * | | | | | | | | | | | | |
| | * | | | | | | | | | | | | |
| | * | | | | | | | | | | | | |
| SUBSEQUENCE PERIOD | 1 | | | | | | | | | | | | |
| INITIAL ADDRESS A[i] | | | | | | | | | | | | | |
| LOWER LIMIT L[i] | | | | | | | | | | | | | |
| UPPER LIMIT U[i] | | | | | | | | | | | | | |

*FIG. 10*

| SYMBOL i | 0 | 1 | 2 | 3 | 4 | 5 | 6 | 7 | 8 | 9 | 10 | 11 | 12 |
|---|---|---|---|---|---|---|---|---|---|---|---|---|---|
| DELAY f(i) | 0 | 4 | 8 | 12 | 16 | 20 | 24 | 28 | 32 | 36 | 40 | 44 | 48 |
| i+f(i) | 0 | 5 | 10 | 15 | 20 | 25 | 30 | 35 | 40 | 45 | 50 | 55 | 60 |
| q(i) | 0 | 0 | 0 | 1 | 1 | 1 | 2 | 2 | 3 | 3 | 3 | 4 | 4 |
| r(i) | 0 | 5 | 10 | 2 | 7 | 12 | 4 | 9 | 1 | 6 | 11 | 3 | 8 |
| ADDRESS (2-DIM) | * | 0 | | | | 0 | | | 5 | | | | 1 |
| | * | 7 | | | | 7 | | | 4 | | | | 0 |
| | * | 6 | | | | 6 | | | 3 | | | | 7 |
| | * | 5 | | | | 5 | | | 2 | | | | 6 |
| | * | 4 | | | | 4 | | | 1 | | | | 5 |
| | * | 3 | | | | 3 | | | 0 | | | | 4 |
| | * | 2 | | | | 2 | | | 7 | | | | 3 |
| | * | 1 | | | | 1 | | | 6 | | | | 2 |
| | * | 0 | | | | 0 | | | 5 | | | | 1 |
| SUBSEQUENCE PERIOD | 1 | 8 | | | | 8 | | | 8 | | | | 8 |
| INITIAL ADDRESS A[i] | | 0 | | | | 0 | | | 5 | | | | 1 |
| LOWER LIMIT L[i] | | 0 | | | | 0 | | | 0 | | | | 0 |
| UPPER LIMIT U[i] | | 7 | | | | 7 | | | 7 | | | | 7 |

*FIG. 11*

| SYMBOL i | 0 | 1 | 2 | 3 | 4 | 5 | 6 | 7 | 8 | 9 | 10 | 11 | 12 |
|---|---|---|---|---|---|---|---|---|---|---|---|---|---|
| DELAY f(i) | 0 | 4 | 8 | 12 | 16 | 20 | 24 | 28 | 32 | 36 | 40 | 44 | 48 |
| i+f(i) | 0 | 5 | 10 | 15 | 20 | 25 | 30 | 35 | 40 | 45 | 50 | 55 | 60 |
| q(i) | 0 | 0 | 0 | 1 | 1 | 1 | 2 | 2 | 3 | 3 | 3 | 4 | 4 |
| r(i) | 0 | 5 | 10 | 2 | 7 | 12 | 4 | 9 | 1 | 6 | 11 | 3 | 8 |
| ADDRESS (2-DIM) 600 | | * | 0 | 8 | 15 | 16 | 0 | 22 | 17 | 5 | 19 | 8 | 11 | 1 |
| | | * | 7 | 15 | 14 | 23 | 7 | 21 | 16 | 4 | 18 | 15 | 10 | 0 |
| | | * | 6 | 14 | 13 | 22 | 6 | 20 | 23 | 3 | 17 | 14 | 9 | 7 |
| | | * | 5 | 13 | 12 | 21 | 5 | 19 | 22 | 2 | 16 | 13 | 8 | 6 |
| | | * | 4 | 12 | 11 | 20 | 4 | 18 | 21 | 1 | 23 | 12 | 15 | 5 |
| | | * | 3 | 11 | 10 | 19 | 3 | 17 | 20 | 0 | 22 | 11 | 14 | 4 |
| | | * | 2 | 10 | 9 | 18 | 2 | 16 | 19 | 7 | 21 | 10 | 13 | 3 |
| | | * | 1 | 9 | 8 | 17 | 1 | 23 | 18 | 6 | 20 | 9 | 12 | 2 |
| | | * | 0 | 8 | 15 | 16 | 0 | 22 | 17 | 5 | 19 | 8 | 11 | 1 |
| SUBSEQUENCE PERIOD | 1 | 8 | 8 | 8 | 8 | 8 | 8 | 8 | 8 | 8 | 8 | 8 | 8 |
| INITIAL ADDRESS A[i] | | 0 | 8 | 15 | 16 | 0 | 23 | 17 | 5 | 19 | 8 | 11 | 1 |
| LOWER LIMIT L[i] | | 0 | 8 | 8 | 16 | 0 | 16 | 16 | 0 | 16 | 8 | 8 | 0 |
| UPPER LIMIT U[i] | | 7 | 15 | 15 | 23 | 7 | 23 | 23 | 7 | 23 | 15 | 15 | 7 |

FIG. 14

| SYMBOL i | 0 | 1 | 2 | 3 | 4 | 5 | 6 | 7 | 8 | 9 | 10 | 11 | 12 |
|---|---|---|---|---|---|---|---|---|---|---|---|---|---|
| DELAY f(i) | 0 | 4 | 8 | 12 | 16 | 20 | 24 | 28 | 32 | 36 | 40 | 44 | 48 |
| i+f(i) | 0 | 5 | 10 | 15 | 20 | 25 | 30 | 35 | 40 | 45 | 50 | 55 | 60 |
| q(i) | 0 | 0 | 0 | 1 | 1 | 1 | 2 | 2 | 3 | 3 | 3 | 4 | 4 |
| r(i) | 0 | 5 | 10 | 2 | 7 | 12 | 4 | 9 | 1 | 6 | 11 | 3 | 8 |
| BLOCK INTERLEAVER WRITE ADDRESS | 0 | 5 | 10 | 2 | 7 | 12 | 4 | 9 | 1 | 6 | 11 | 3 | 8 |
| $f_M(i)+1$ | 1 | 1 | 1 | 14 | 14 | 14 | 27 | 27 | 40 | 40 | 40 | 53 | 53 |
| MULTIPLEXED INTERLEAVER ADDRESS (2-DIM) | 0 | 0 | 0 | 0 | | | | | | | | | |
| | | | | | 0 | | | | | | | | |
| | | | | | | 0 | | | | | | | |
| | | | | | | | 0 | | | | | | |
| | | | | | | | | | 0 | | | | |
| | | | | | | | | | | 0 | | | |
| | | | | | | | | | | | 0 | | |
| | | | | | | | | | | | | 0 | |
| | | | | | | | | | | | | | 0 |
| | | | | | | | | | | | | | |
| | | | | | | | | | | | | | 0 |
| | | | | | | | | | | | | | |
| | | | | | | | | | | | | | |
| | 0 | | | | | | | | | | | | |

*FIG. 15*

| SYMBOL i | | 0 | 1 | 2 | 3 | 4 | 5 | 6 | 7 | 8 | 9 | 10 | 11 | 12 |
|---|---|---|---|---|---|---|---|---|---|---|---|---|---|---|
| DELAY f(i) | | 0 | 4 | 8 | 12 | 16 | 20 | 24 | 28 | 32 | 36 | 40 | 44 | 48 |
| i+f(i) | | 0 | 5 | 10 | 15 | 20 | 25 | 30 | 35 | 40 | 45 | 50 | 55 | 60 |
| q(i) | | 0 | 0 | 0 | 1 | 1 | 1 | 2 | 2 | 3 | 3 | 3 | 4 | 4 |
| r(i) | | 0 | 5 | 10 | 2 | 7 | 12 | 4 | 9 | 1 | 6 | 11 | 3 | 8 |
| BLOCK INTERLEAVER WRITE ADDRESS | | 0 | 5 | 10 | 2 | 7 | 12 | 4 | 9 | 1 | 6 | 11 | 3 | 8 |
| $f_M(i)+1$ | | 1 | 1 | 1 | 14 | 14 | 14 | 27 | 27 | 40 | 40 | 40 | 53 | 53 |
| MULTIPLEXED INTERLEAVER ADDRESS (2-DIM) | 0 | 0 | 0 | 0 | 0 | 1 | 2 | 3 | 5 | 7 | 10 | 13 | 16 | 20 |
| | 24 | | | | 0 | 1 | 2 | 4 | 6 | 9 | 12 | 15 | 19 | |
| | 23 | | | | | 0 | 1 | 3 | 5 | 8 | 11 | 14 | 18 | |
| | 22 | | | | | | 0 | 2 | 4 | 7 | 10 | 13 | 17 | |
| | 21 | | | | | | | 1 | 3 | 6 | 9 | 12 | 16 | |
| | 20 | | | | | | | 0 | 2 | 5 | 8 | 11 | 15 | |
| | 19 | | | | | | | | 1 | 4 | 7 | 10 | 14 | |
| | 18 | | | | | | | | 0 | 3 | 6 | 9 | 13 | |
| | 17 | | | | | | | | | 2 | 5 | 8 | 12 | |
| | 16 | | | | | | | | | 1 | 4 | 7 | 11 | |
| | 15 | | | | | | | | | 0 | 3 | 6 | 10 | |
| | 14 | | | | | | | | | | 2 | 5 | 9 | |
| | 13 | | | | | | | | | | 1 | 4 | 8 | |
| | 12 | | | | | | | | | | 0 | 3 | 7 | |
| | 11 | | | | | | | | | | | 2 | 6 | |
| | 10 | | | | | | | | | | | 1 | 5 | |
| | 9 | | | | | | | | | | | 0 | 4 | |
| | 8 | | | | | | | | | | | | 3 | |
| | 7 | | | | | | | | | | | | 2 | |
| | 6 | | | | | | | | | | | | 1 | |
| | 5 | | | | | | | | | | | | 0 | |
| | 4 | | | | | | | | | | | | | |
| | 3 | | | | | | | | | | | | | |
| | 2 | | | | | | | | | | | | | |
| | 1 | | | | | | | | | | | | | |
| | 0 | | | | | | | | | | | | | |

| SYMBOL i | 0 | 1 | 2 | 3 | 4 | 5 | 6 | 7 | 8 | 9 | 10 | 11 | 12 |
|---|---|---|---|---|---|---|---|---|---|---|---|---|---|
| INTERLEAVER DELAY | 0 | 4 | 8 | 12 | 16 | 20 | 24 | 28 | 32 | 36 | 40 | 44 | 48 |
| DE-INTERLEAVER DELAY | 48 | 16 | 36 | 4 | 24 | 44 | 12 | 32 | 0 | 20 | 40 | 8 | 28 |

US 7,225,306 B2

EFFICIENT ADDRESS GENERATION FOR FORNEY'S MODULAR PERIODIC INTERLEAVERS

RELATED PATENT APPLICATIONS

This application claims the benefit, under 35 U.S.C. §119(e)(1), of U.S. Provisional Application Ser. No. 60/582, 740, entitled Efficient Address Generation For Forney's Modular Periodic Interleavers, filed Jun. 23, 2004 by Po Tong, which is hereby incorporated by reference in its entirety herein.

BACKGROUND OF THE INVENTION

1. Field of the Invention

This invention relates generally to interleaving techniques associated with correction of error bursts in ADSL/VDSL digital communication systems, and more particularly to a method of efficiently generating addresses for Forney's modular periodic interleavers to minimize memory requirements.

2. Description of the Prior Art

Interleaving techniques have often been used in conjunction with error correction codes to correct error bursts and to improve the reliability of ADSL/VDSL communication systems. A typical interleaving scheme 10 is shown in FIG. 1 that includes an encoder 12 for encoding an incoming stream of data and an interleaver 14 that interleaves the encoded signal such that the error burst in a channel 16 is spread over multiple code words as a result of the interleaving scheme 10. The encoding and interleaving of data occur as part of the data transmission process of a transmitter. The encoded interleaved signal is then received by a receiver that includes a de-interleaver 18 that unscrambles the interleaving, and a decoder 20 that decodes the encoded signal. More specifically, the interleaver 14 permits the ordering of the sequence of symbols in a deterministic manner, while the de-interleaver applies an inverse permutation to restore the sequence to it original ordering.

A row-column block interleaver 100 is shown in FIG. 2 that is useful to describe the type of permutation implemented by an interleaver. The input symbol stream is divided into blocks of data having a designated Length 102. Also defined is an interleaving Depth 104. Data is written into a memory 106 that is divided into a number of rows of Length 102 equal to a designated number of symbols per block and a number of columns equal to a desired interleaving Depth 104. Data is read into the interleaver memory 106 in a column-by-column fashion, and is read out of the interleaver memory 106 in a row-by-row fashion. An amount of memory equal to Length*Depth is then used for a single block of data. Two such blocks are typically used to permit data to be read from one memory block while the other memory block is being written into. Inverse permutation is accomplished by writing into the de-interleaver in a row-by-row fashion and reading out of the de-interleaver in a column-by-column fashion. Those skilled in the art will readily appreciate the total amount of memory necessary to implement such a system is typically 4*Length*Depth; and the total latency through the interleaver and de-interleaver is 2*Length*Depth.

FIG. 3 depicts one embodiment of a double buffered memory 200 that is suitable for implementing row-column block interleaving such as described herein above. The interleaving process is straightforward as the lower numbers in memory A 202 represent time slots for writing; while the upper numbers in memory B 204 represent time slots for reading. A relatively large period equal to Length*Depth is also a concern when using a row-column block interleaving scheme. A row-column block interleaver can be specified completely by a sequence of periodic delays f(0), f(1), . . . , such as, for example, (24,26,28, . . . , 36,38,17, 19,21, . . . , 29,31,10,12,14, . . . , 22,24, . . . ) in FIG. 3. These delays are non-negative (causal). An interleaver is periodic if the sequence of delays f(0), f(1), . . . , are periodic. All practical interleavers are periodic. Periodic interleavers were first introduced by Ramsey and Forney around 1970. See, for example, J. L. Ramsey, "Realization of Optimum Interleavers", IEEE Information Theory, Vol. IT-16, Number 3, May 1970, pp. 338–345; and G. D. Forney, "Burst-Correcting Codes for the Classic Bursty Channel," IEEE Trans. Communication Technology, Vol. COM-19, Oct. 1971, pp. 772–781.

U.S. Pat. No. 5,764,649, entitled "Efficient Address Generation For Convolutional Interleaving Using a Minimal Amount Of Memory," issued Jun. 9, 1998 to Po Tong, describes a convolutional interleaving process utilizing an addressing scheme which enables the amount of memory used to be reduced. The described interleaving process uses a plurality of delay related arrays which cooperate with a designated block length to define the delay associated with each symbol in a given block, as well as an initial value array, a lower limit array, and an upper limit array. The initial value, lower limit and upper limit arrays are computed during start-up and used to generate a convolutional interleaving addressing scheme.

In view of the foregoing, it would be highly desirable and advantageous to provide an improved addressing scheme that further reduces the amount of computations to set up the interleavers during start-up.

SUMMARY OF THE INVENTION

The present invention is directed to an efficient way to generate the address sequence for the RAM implementation of Forney's (P,D,m) interleavers with delays $f(i)=(im \bmod P)D$, $0 \leq i < P$. The number of memory locations required is only $A+1+2P$, which is close to the theoretical minimum. Here $A=(P-1)D/2$ is the average delay of the symbols through the (P,D,m) interleaver. The address generation circuit (with simple adders and registers) works for variable P,D,m. This is achieved by decomposing the (P,D,m) interleaver into a concatenation of a multiplexed interleaver (implemented with $A+1$ memory locations), followed by a block interleaver (implemented with 2P memory locations). In many applications, these 2P memory locations can be treated as part of the memory for controlling the data flow of the system.

According to one embodiment, a method of generating an address sequence comprises decomposing a Forney's (P,D, m) interleaver with delays $f(i)=(im \bmod P)D$, $0 \leq i < P$, into a concatenation of a multiplexed interleaver with period P and delays $f_M(i)=q(i)P$, and a block interleaver with period P and delays $f_B(i)=r(i)-i+P$, wherein q(i) and r(i) are defined by $i+f(i)=q(i)P+r(i)$, $0 \leq r(i) < P$, and further wherein P is an arbitrary period, D is an arbitrary delay parameter and m is an integer greater than zero and less than P and that satisfies $\gcd(P,m)=1$ and $\gcd(P,1+mD)=1$.

According to another embodiment, a method of generating an address sequence comprises the steps of providing a first counter operational as an incrementer of mod P such that the first counter increments by 1 mod P on each successive time slot defined as i, wherein $0 \leq i < P$; initializing the first counter with 0; providing a second counter operational as an incrementer of mod D such that the second counter increments by ($\lfloor mD/P \rfloor$+first carry) mod D on each successive time slot i, wherein first carry=0 if (f(i) mod P)+(mD mod P))<P and further wherein first carry=1 otherwise; initializing the second counter with 0; providing a third counter operational as an incrementer of mod P such that the third counter increments by (mD mod P) mod P on each successive time slot i; initializing the third counter with 0; adding the first and third counter counts to generate r(i)modP+second carry there from; adding the second counter counts and the second carry counts to generate q(i) there from, wherein q(i) and r(i) are used in the representation of i+f(i)=q(i)P+r(i), $0 \leq r(i) < P$, using the relationships r(i)mod P=((f(i)mod P)+i)mod P and q(i)=$\lfloor f(i)/P \rfloor$+second carry, wherein second carry=0 if (f(i)mod P)+i<P, and further wherein second carry=1 otherwise, and wherein P is an arbitrary period and D is an arbitrary delay parameter; accumulating r(i) and time slot i, and generating a block interleaver write address sequence and a block interleaver read address sequence there from; and accumulating q(i) mod (A+1), wherein A is the average interleaver delay and is equal to (P−1)D/2, and generating a multiplexed interleaver address sequence there from, and further wherein m is an integer greater than zero and less than P (0<m<P) and satisfies gcd (P,m)=1 and gcd (P,1+mD)=1.

According to yet another embodiment, a method of generating an address sequence comprises decomposing a Forney's (P,D,n) interleaver with delays f(i+1)mod P=(f(i)+nD) mod PD, $0 \leq i < P$, into a concatenation of a multiplexed interleaver with period P and delays $f_M(i)=q(i)P$, and a block interleaver with period P and delays $f_B(i)=r(i)-i+P$, wherein q(i) and r(i) are defined by i+f(i)=q(i)P+r(i), $0 \leq r(i) < P$, and further wherein P is an arbitrary period, D is an arbitrary delay parameter, m is an integer greater than zero and less than P (0<m<P) and satisfies gcd (P,m)=1 and gcd (P,1+mD)=1 and n=−m(1+mD)$^{-1}$ mod P.

According to still another embodiment, a method of generating an address sequence comprises the steps of providing a first counter operational as an incrementer of mod P such that the first counter increments by 1 mod P on each successive time slot defined as i, wherein $0 \leq i < P$, wherein P is an arbitrary period; initializing the first counter with 0; providing a second counter operational as an incrementer of mod D such that the second counter increments by ($\lfloor nD/P \rfloor$+first carry) mod D on each successive time slot i, wherein D is an arbitrary delay parameter, and further wherein first carry=0 if (f(i) mod P)+(nD mod P)<P and further wherein first carry=1 otherwise; initializing the second counter with $\lfloor (P-1)D/P \rfloor$; providing a third counter operational as an incrementer of mod P such that the third counter increments by (nD mod P)mod P on each successive time slot i; initializing the third counter with (P−1)D mod P; adding the first and third counter counts to generate r(i) and second carry there from, wherein second carry=0 if (f(i)mod P)+i<P, and further wherein second carry=1 otherwise; adding the second counter counts and the second carry to generate q(i) there from, wherein q(i) and r(i) are used in the representation of i+f(i)=q(i)P+r(i), $0 \leq r(i) < P$, using the relationships r(i)mod P=((f(i)mod P)+i)mod P and q(i)=$\lfloor f(i)/P \rfloor$+second carry; accumulating r(i) and time slot i, and generating a block interleaver write address sequence and a block interleaver read address sequence there from; and accumulating q(i) mod (A+1), wherein A is the average interleaver delay and is equal to (P−1)D/2, and generating a multiplexed interleaver address sequence there from, wherein n=−m(1+mD)$^{-1}$ mod P, and further wherein m is an integer greater than zero and less than P (0<m<P) and satisfies gcd (P, m)=1 and gcd (P, 1+mD)=1.

According to still another embodiment, a method of generating an address sequence for a RAM implementation of Forney's (P,D,m) interleavers and their inverse (P,D,n) interleavers comprises the steps of providing a first counter operational as an incrementer of mod P such that the first counter increments by 1 mod P on each successive time slot defined as i, wherein $0 \leq i < P$, wherein P is an arbitrary period; initializing the first counter with 0; providing a second counter operational as an incrementer of mod P such that the second counter increments by (nD mod P) mod P on each successive time slot i for the (P,D,n) interleaver, and such that the second counter increments by mD modD on each successive time slot i for the (P, D, m) interleaver, wherein n=−m(1+mD)$^{-1}$ mod P, m is an integer greater than zero and less than P (0<m<P) and satisfies gcd (P,m)=1 and gcd (P,1+mD)=1, and D is an arbitrary delay parameter; initializing the second counter with (P−1)D mod P for the (P,D,n) interleaver, and with 0 for the (P,D,m) interleaver; providing a third counter operational as an incrementer of mod D such that the third counter increments by ($\lfloor nD/P \rfloor$+first carry) mod D, for the (P,D,n) interleaver, wherein first carry is zero if and only if (f(i)mod P)+(nD mod P)<P, and is equal to one otherwise, and further such that the third counter increments by ($\lfloor mD/P \rfloor$+first carry) mod D for the (P,D,m) interleaver, wherein first carry is zero if and only if (f(i)mod P)+(mD mod P)<P, and is equal to one otherwise; initializing the third counter with $\lfloor (P-1)D/P \rfloor$ for the (P,D,n) interleaver and with 0 for the (P,D,m) interleaver; adding the first and second counter counts to generate r(i) and second carry there from, wherein second carry=0 if (f(i)mod P)+i<P, and further wherein second carry=1 otherwise; adding the third counter counts and the second carry counts to generate q(i) there from; accumulating r(i) and time slot i, and generating a block interleaver write address sequence and a block interleaver read address sequence there from; and accumulating q(i)mod (A+1), wherein A is the average interleaver delay and is equal to (P−1)D/2, and generating a multiplexed interleaver address sequence there from.

According to still another embodiment, an address sequence generator for a RAM implementation of Forney's (P,D,m) interleavers comprises a concatenation of a multiplexed interleaver with period P and delays $f_M(i)=q(i)P$, and a block interleaver with period P and delays $f_B(i)=r(i)-i+P$, wherein q(i) and r(i) are defined by i+f(i)=q(i)P+r(i), for $0 \leq r(i) < P$, and further wherein P is an arbitrary period, D is an arbitrary delay parameter and m is an integer greater than zero and less than P and that satisfies gcd (P,m)=1 and gcd (P,1+mD)=1, and further wherein the Forney's (P,D,m) interleaver has delays f(i)=(im mod P)D, $0 \leq i < P$.

According to still another embodiment, an address sequence generator for a RAM implementation of Forney's (P,D,m) interleavers and their inverse (P,D,n) interleavers comprises first counting means for incrementing from 0 by 1 mod P on each successive time slot defined as i, wherein $0 \leq i < P$, wherein P is an arbitrary period; second counting means for incrementing from (P−1)D mod P by (nD mod P) mod P on each successive time slot i for the (P,D,n) interleaver, and from 0 by (mD mod P) mod P on each successive time slot i for the (P,D,m) interleaver, wherein D is an arbitrary delay parameter, m is an integer greater than zero and less than P (0<m<P) and satisfies gcd (P,m)=1 and gcd P,1+mD)=1, and n=−m(1+mD)$^{-1}$ mod P; third counting means for incrementing from $\lfloor (P-1)D/P \rfloor$ by ($\lfloor nD/P \rfloor$+first carry) mod D, for the (P,D,n) interleaver, wherein first carry is zero if and only if (f(i)mod P)+(nD mod P)<P, and is equal to one otherwise, and from 0 by ($\lfloor$mD/P$\rfloor$+first carry) mod D, for the (P,D,m) interleaver, wherein first carry is zero if and only if (f(i)mod P)+(mD mod P)<P, and is equal to one otherwise; means for adding the first means counts and the second means counts to generate r(i) and second carry counts there from; means for adding the third means counts and the second carry counts to generate q(i) there from, wherein q(i) and r(i) are used in the representation of i+f(i)=q(i)P+r(i), 0≦r(i)<P, using the relationships r(i)mod P=((f(i)mod P)+i)mod P and q(i)=$\lfloor$f(i)/P$\rfloor$+second carry, wherein second carry=0 if (f(i)mod P)+i<P, and further wherein second carry=1 otherwise; means for accumulating r(i) and time slot i, and generating a block interleaver write address sequence and a block interleaver read address sequence there from; and means for accumulating q(i)mod (A+1), wherein A is the average interleaver delay and is equal to (P−1)D/2, and generating a multiplexed interleaver address sequence there from.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein:

FIG. 1 is a block diagram illustrating a typical interleaving/de-interleaving process;

FIG. 4 depicts use of a random access memory showing the number of symbols in the interleaver memory as data is passed into and out of the interleaver with P=4, D=2 and m=1;

FIG. 9 illustrates use of the one-RAM implementation shown in FIG. 5 for an input symbol with P=13, D=4 and m=1;

FIG. 10 illustrates the use of the one-RAM implementation shown in FIG. 5 to depict generation of the address sequence resulting for the input symbol shown in FIG. 9;

FIG. 11 illustrates the complete 2-dimensional address array that results from passing the input symbol shown in FIGS. 9 and 10 through the one-RAM implementation shown in FIG. 5;

FIG. 14 illustrates generation of address sequences for decomposed block and multiplexed interleavers for an input symbol with P=13, D=4 and m=1 to depict the next occurrence of the same address;

FIG. 15 is a more complete diagram illustrating generation of a multiplexed interleaver two-dimensional address array for the input symbol shown in FIG. 14;

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

The preferred embodiments described herein below are best understood by first presenting a background about Forney's (P,D,m) modular periodic interleavers, where P is an arbitrary period, D is an arbitrary delay parameter and m is an integer with 0<m<P that satisfies:
  (a) (greatest common divisor) gcd (P,m)=1; and
  (b) gcd (P,mD+1)=1.

Interleaver delays for the (P,D,m) interleaver are, in order: 0,(m mod P)D, (2m mod P)D, . . . , ((P−1)m mod P)D. Condition (a) guarantees that the delays are all distinct. Condition (b) guarantees that no two symbols are being scheduled to be output at the same time.

Special cases of (P,D,m) interleavers include the case where m=1 and the case where m=1 and D is a positive integer multiple of P. The first case, where m=1, is used in the ITU Standard for asymmetric digital subscriber lines (ADSL), referred to as convolutional interleavers in the ITU Standard. In this case, the period P equals the block code length and the sequence of delays are: 0,D,2D, . . . , (P−1)D. Consecutive symbols in a codeword for this case are separated by (D+1) symbols at the interleaver output. The parameter D plays a role similar to the depth of the matrix in a row-column block interleaver. The average delay for this case=(P−1)D/2≈length*depth/2; and the memory required ≈ average delay. The second case, where m=1 and D=positive integer multiple of P, is proposed in the ITU VDSL (very high speed digital subscriber line) Standard, where (P,D,m) interleavers are referred to as "triangular interleavers."

In Forney's published work, (P,D,m) interleavers were implemented using shift registers. The implementations discussed herein below focus on using random access memory (RAM) for the variables P,D and m. Looking now at FIG. 4, a random access memory 300 depicts the number of symbols 302 in the interleaver memory 300 as data is passed into and out of the interleaver. The minimum memory required when using this scheme can be seen to equal the average delay which equals $(P-1)D/2=3$ symbols.

Figure 2:
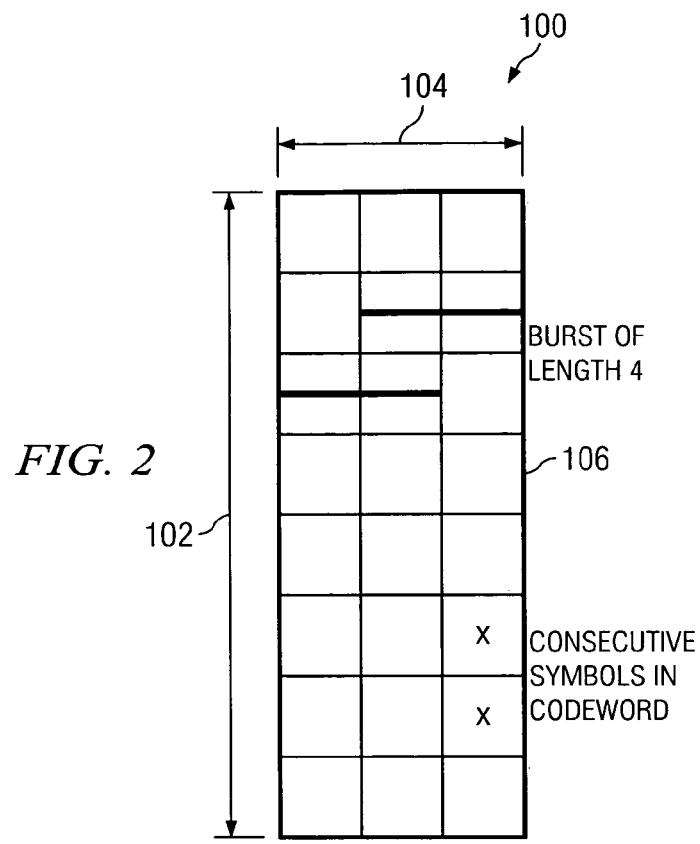
FIG. 2 depicts a typical row-column block interleaver structure.
Figure 3:
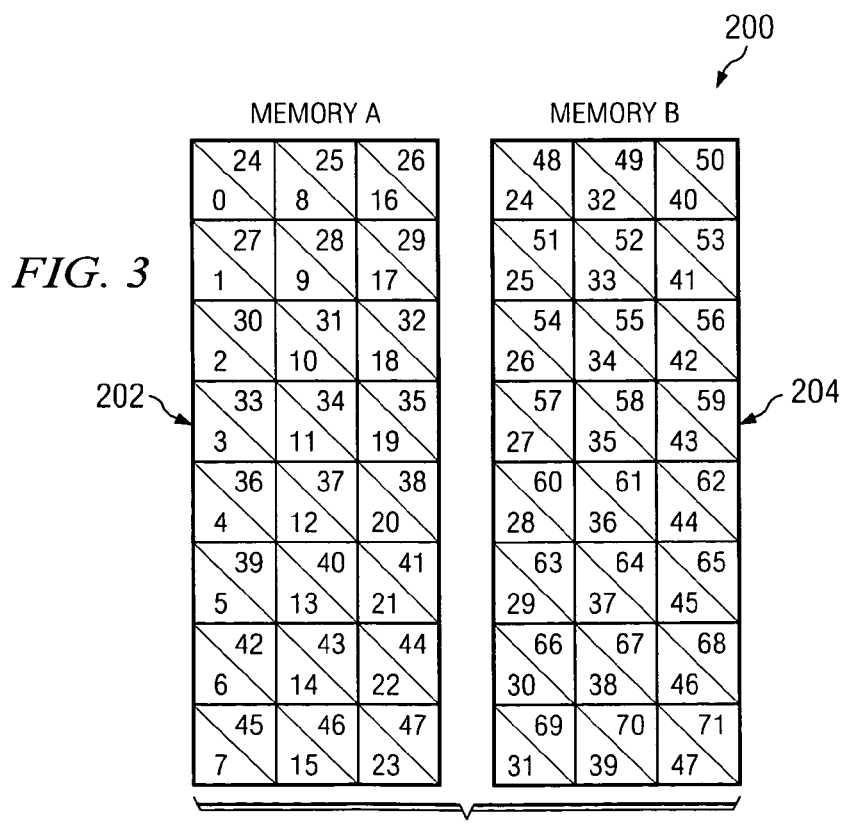
FIG. 3 illustrates one implementation of a double buffered memory associated with a row-column block interleaver.
Figures 5, 6, 7, 8:
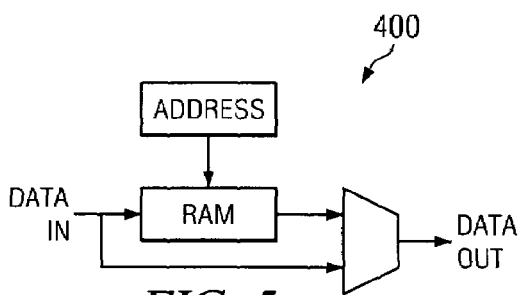
FIG. 5 is a block diagram illustrating a one-RAM implementation suitable to implement the passing of data as shown in FIG. 4.
FIG. 6 illustrates use of the one-RAM implementation shown in FIG. 5 for an input symbol with P=4, D=2 and m=1 to depict the next occurrence of the same address.
FIG. 7 illustrates the use of the one-RAM implementation shown in FIG. 5 to depict the address sequence resulting for the input symbol shown in FIG. 6.
FIG. 8 illustrates a re-arrangement of the address sequence shown in FIG. 7 into a 2-dimensional array.

FIG. 5 is a block diagram illustrating a single-RAM structure 400 that is suitable to implement the passing of data into and out of the interleaver memory depicted in FIG. 4. The same address is used for both writing and reading; and so old data must be read from the specified location before new data is written for each address.

FIGS. 6 and 7 illustrate the use of RAM addresses as symbols are written into and out of the RAM, where P=4, D=2 and m=1. The appearance of an asterisk (*) in each figure represents the start of each period. With continued reference now to FIG. 7, symbol 1, which will be delayed by 2 symbols, is written into address 0. Symbol 2 is then written into address 2 which will be delayed by 4 symbols. Symbol 3 is then written back into address 0 AFTER symbol 1 was read from the same addresss. This process then repeats itself; and the resulting address use can be seen as 020, 121,020, . . . , where the average delay=3 symbols.

FIG. 8 illustrates a re-arrangement of the address sequence shown in FIG. 7 into a 2-dimensional array 500. Two-dimensional array 500 can be seen to have a two-dimensional address array having a subsequence period=1, 2,1,2.

FIG. 9 illustrates use of the one-RAM implementation shown in FIG. 5 for an input symbol with P=13, D=4 and m=1. Two additional terms, q(i) and r(i) are also shown in FIG. 9. These additional terms, applicable to periodic interleavers, are determined from the relationship $i+f(i)=q(i)P+r(i)$ for $0 \leq i \leq P-1$, where P is the period and is equal to 13 in the instant case, and where f(i) is the delay and is equal to 0,4,8, . . . in the instant case.

FIG. 10 depicts generation of the address sequence resulting from passing the input symbol shown in FIG. 9 through the one-RAM implementation shown in FIG. 5. The resultant subsequence period, initial address A[i], lower address limit L[i] and upper address limit U[i] are also shown.

FIG. 11 illustrates the complete 2-dimensional address array 600 that results from passing the input symbol shown in FIGS. 9 and 10 through the one-RAM implementation 400. The memory required-to pass the symbol into and out of the single-RAM interleaver memory 400 can be shown from FIG. 11 to be 24 symbols which is equal to the average delay period.

The present inventor alone recognized that more efficient generation of addresses for Forney's modular periodic interleavers in order to minimize memory requirements, and to minimize computations to set up the interleavers during start-up, could be accomplished by decomposing the (P,D,m) interleaver into a multiplexed interleaver (implemented with A+1 memory locations), followed by a block interleaver (implemented with 2P memory locations). Stated differently, a periodic interleaver with period P and average delay A is equivalent to the concatenation of a multiplexed interleaver of period P and average delay A, followed by a block interleaver of period (and average delay) P.

Figure 12:
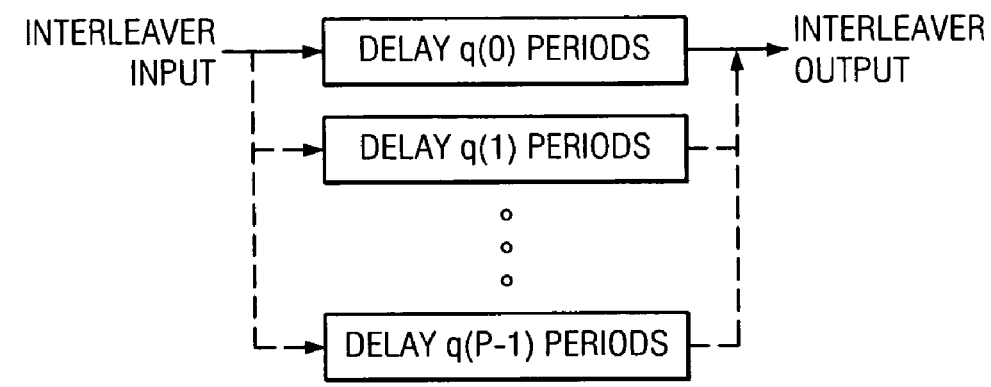
FIG. 12 is a diagram illustrating a periodic interleaver in terms of a period P and a delay f(i)=q(i)P.

Looking now at FIG. 12, a diagram illustrates a periodic interleaver 700 in terms of a period P and a delay $f(i)=q(i)P$. The present inventor recognized: 1) A periodic interleaver with period P and delay f(i) is called a multiplexed interleaver iff $f(i)=q(i) P$, $0 \leq i < P$, where q(i) is a non-negative integer; 2) A periodic interleaver with period P and delay f(i) is called a block interleaver iff $\{i+f(i):0 \leq i < P\} = \{P, P+1, P+2, \ldots, 2P-1\}$; and 3) Further, two interleavers with delays $f_1(i), f_2(i), i=0,1,\ldots$ are equivalent iff the differences $f_1(i)-f_2(i)$ are the same for all i.

Figure 13:
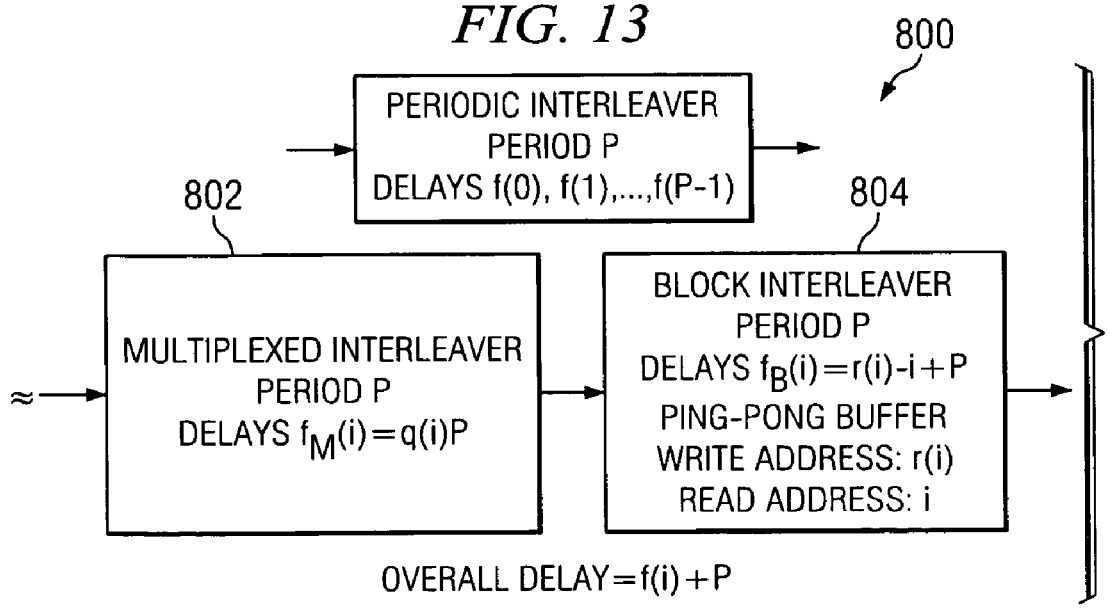
FIG. 13 is a diagram illustrating decomposition of the periodic interleaver shown in FIG. 12 into the concatenation of a multiplexed interleaver of period P and average delay A, followed by a block interleaver of period (and average delay) P.

FIG. 13 is a diagram illustrating decomposition of a periodic interleaver 800 into the concatenation of a multiplexed interleaver 802 of period P and average delay A, followed by a block interleaver 804 of period (and average delay) P. The multiplexed interleaver 802 is defined by a period P and a delay $f_M(i)=q(i)P$. The block interleaver 804 is defined by a period P, delay $f_B(i)=r(i)-i+P$, write address r(i), read address i, and employs a ping-pong buffer memory. The overall delay resulting from the concatenation of multiplexed interleaver 802 and block interleaver 804 is f(i)+P.

In view of the foregoing, a one-RAM multiplexed interleaver can be implemented by first considering a multiplexed interleaver with delays $f(i)=q(i)P$ for $0 \leq i \leq P-1$ and having an average delay $A=q(0)+q(1)+ \ldots +q(P-1)$ and then also considering an equivalent interleaver with delays $q(i)P+1$ for $0 \leq i \leq P-1$ and having an average delay A+1. The required address sequence can then be generated by taking the partial sums mod(A+1) of the periodic sequence formed by repeating q(0), q(1), . . . , q(P-1), i.e.
S(0)=0; $S(i+1)=(S(i)+q(i \bmod P)) \bmod (A+1)$. An example using
P=13 produces: q(i)=0, 0, 0, 1, 1, 1, 2, 2, 3, 3, 3, 4, 4
S(i)=0, 0, 0, 0, 1, 2, 3, 5, 7, 10, 13, 16, 20, 24, 24, 24, 24, 0, 1, 2, 4, 6, 9, 12, 15, 19, 23, . . .

FIG. 14 illustrates generation of address sequences for decomposed block and multiplexed interleavers for an input symbol with P=13, D=4 and m=1 to depict the next occurrence of the same address; while FIG. 15 is a more complete diagram illustrating generation of a multiplexed interleaver two-dimensional address array for the input symbol shown in FIG. 14.

Figures 16, 17:
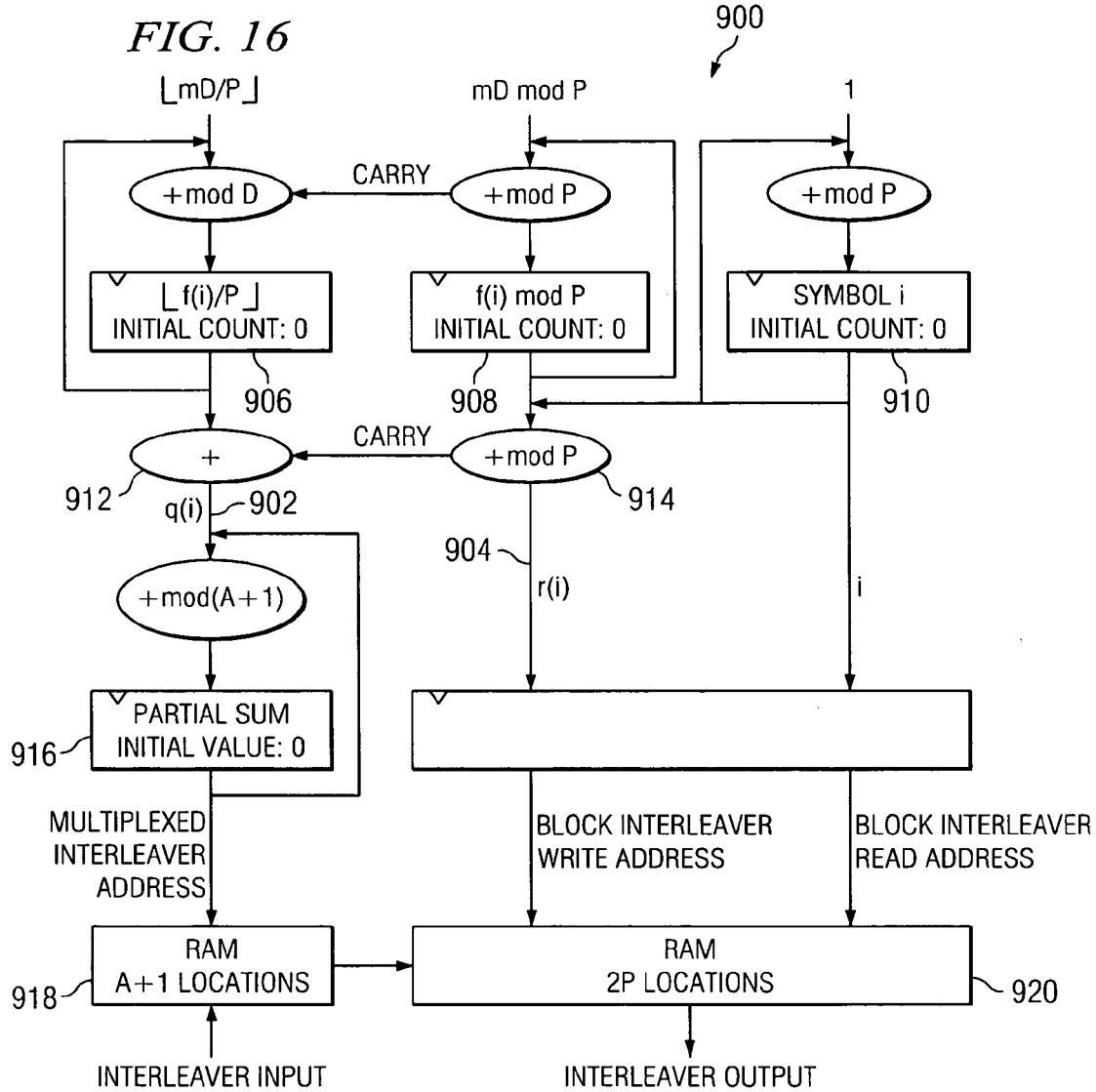
FIG. 16 is a flow diagram illustrating efficient address generation for a RAM implementation of a (P,D,m) interleaver according to one embodiment of the present invention.
FIG. 17 is a diagram illustrating realignment of an interleaver output with a de-interleaver period boundary (by shifting the symbol index by a fixed offset of $-n^{-1}$modP) for a symbol with P=13, D=4, m=1 and n=5.

FIG. 16 is a flow diagram 900 illustrating efficient address generation for a RAM implementation of a (P,D,m) interleaver according to one embodiment of the present invention. As stated herein before, a (P,D,m) interleaver with delays $f(i)=(im \bmod P)D$, $0 \leq i < P$, can be decomposed into a multiplexed interleaver with period P and delays $f_M(i)=q(i)P$, and a block interleaver with period P and delays $f_B(i)=r(i)-i+P$, where q(i) and r(i) are defined by $i+f(i)=q(i)P+r(i)$, $0 \leq r(i) < P$. The upper portion of FIG. 16 shows the logic diagram for the generation of q(i) 902 and r(i) 904 and can be seen to include three counters 906, 908, 910. The rightmost counter 910 is simply an incrementer mod P. The initial value of this counter 910 is zero. On each successive time slot, the counter 910 increments by 1 mod P, and tracks the symbol index i. In other words, $i \leftarrow (i+1) \bmod P$. Noting that f(0)=0, and recalling that $f(i+1) \bmod p = (f(i)+mD) \bmod PD$ for all $0 \leq i < P$, as stated herein before, these two equations characterize the implementation of the left and middle counters 906, 908 respectively. These counters 906, 908 hold the value f(i), that is initially set to 0, and updated on successive time slots by $f(i) \leftarrow (f(i)+mD) \bmod PD$. The value, $f(i)=\lfloor f(i)/P \rfloor P+(f(i) \bmod P)$ is represented as an ordered pair $(\lfloor f(i)/P \rfloor, f(i) \bmod P)$. The left counter 906 holds the value $\lfloor f(i)/P \rfloor$, while the middle counter 908 holds the value $f(i) \bmod P$. These counters 906, 908 are initialized with zeros. On each successive time slot, the value of these counters are updated by adding $mD=\lfloor mD/P \rfloor P+(mD \bmod P)$, which is represented as an ordered pair $(\lfloor mD/P \rfloor, mD \bmod P)$.

The update $f(i) \leftarrow (f(i)+mD) \bmod PD$ is realized by updating the two ordered pair entries as follows:

$f(i) \bmod P \leftarrow ((f(i) \bmod P) + (mD \bmod P)) \bmod P$, and $\lfloor f(i)/P \rfloor \leftarrow (\lfloor f(i)/P \rfloor + \lfloor mD/P \rfloor + \text{carry}) \bmod D$, where carry=0 if $(f(i) \bmod P)+(mD \bmod P) < P$, and carry=1 otherwise.

The two adders 912, 914 immediately below the three counters 906, 908, 910 are used to compute q(i) and r(i) in the representation of i+f(i)=q(i)P+r(i), 0≦r(i)<P, using the equations:

$$r(i)=((f(i) \bmod P)+i) \bmod P, \text{ and}$$

$$q(i)=\lfloor f(i)/P \rfloor + \text{carry},$$

where carry=0 if (f(i)modP)+i<P, and carry=1 otherwise.

Recalling now that the average delay A of the (P,D,m) interleaver is A=(P−1)D/2, the q(i)'s are fed into an accumulator 916, modulo A+1, for the computation of the partial sum S(i) which is the address sequence for the periodic interleaver equivalent to the multiplex interleaver with period P and delays $f_M(i)$=q(i)P. This equivalent periodic interleaver has delays which are one greater than the corresponding delays for the multiplex interleaver. The period boundary at the output of the first RAM 918, as a result, is offset from the input by one. This offset is compensated by the register which delays both the r(i)'s and the symbol index i by one time slot before they are used as the write and read addresses for the block interleaver RAM 920 respectively.

The inverse of a (P,D,m) interleaver is a (P,D,n) interleaver where n=−m(1+mD)$^{-1}$modP. It should be noted that the interleaver output needs to be appropriately aligned with the de-interleaver period boundary (by shifting the symbol index by a fixed offset of −n$^{-1}$modP). FIG. 17 is a diagram illustrating realignment of an interleaver output with a de-interleaver period boundary (by shifting the symbol index by a fixed offset of −n$^{-1}$modP) for a symbol with P=13, D=4, m=1 and n=5.

Figure 18:
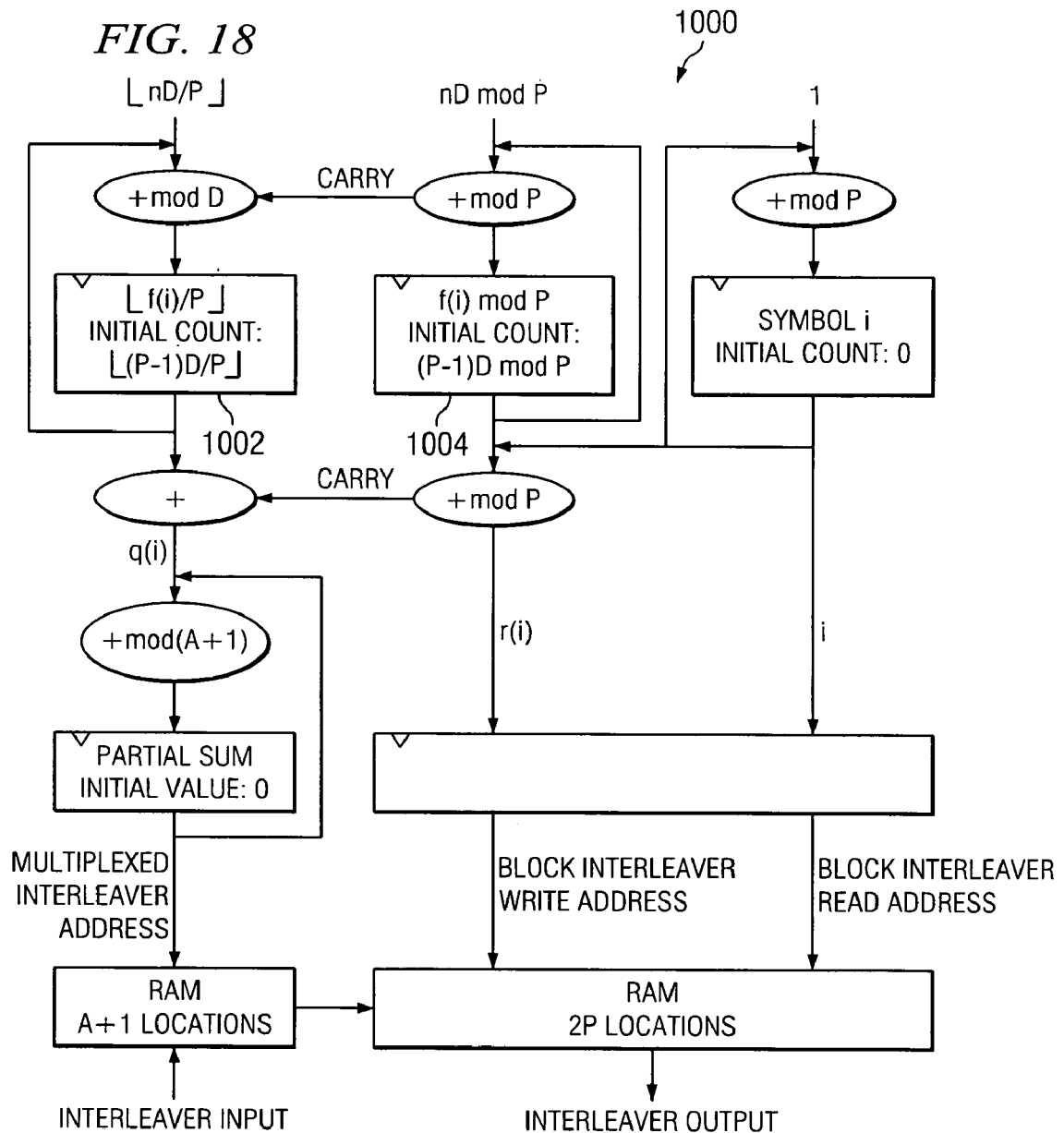
FIG. 18 is a flow diagram illustrating efficient address generation for a RAM implementation of an inverse (P,D,m) interleaver, where n=−m(1+mD)$^{-1}$modP, according to one embodiment of the present invention.

FIG. 18 is a flow diagram 1000 illustrating efficient address generation for a RAM implementation of an inverse (P,D,m) interleaver, where n=−m(1+mD)$^{-1}$modP, according to one embodiment of the present invention. Recalling in the definition of a (P,D,m) interleaver that P is an arbitrary period, D is an arbitrary delay parameter, and m is an integer is 0<m<P that satisfies:

(a) gcd (P,m)=1, and
(b) gcd (P, 1+mD)=1,

It is noted that the inverse of a (P,D,m) interleaver is a (P,D,n) interleaver, where n=−m(1+md)$^{-1}$modP and the period boundary of the inverse interleaver is offset by n$^{-1}$modP when compared with the period boundary of the interleaver. It should be noted that one may choose to keep the period boundary of the inverse (P,D,n) interleaver the same as the original (P,D,m) interleaver. In this case, symbol 0 at the output of the (P,D,m) interleaver will also be symbol 0 at the input to the (P,D,n) interleaver. The delay of this symbol through the (P,D,n) interleaver is $$f(0)=((0-n^{-1} \bmod P)n \bmod P)D=(-1 \bmod P)D=(P-1)D.$$

This delay f(0), together with other delays f(i) for the (P,D,n) interleaver, satisfy:

$$f((i+1) \bmod P)=(f(i)+nD) \bmod PD \text{ for all } 0 \leq i < P.$$

These two equations characterize the two only differences between the implementation of the inverse (P,D,n) interleaver shown in FIG. 18 and the original (P,D,m) interleaver shown in FIG. 16.

With continued reference now to FIG. 18, the initial delay f(0) is set to (P−1)D. The left counter 1002, as a result, is initialized with ⌊(P−1)D/P⌋, and the middle counter 1004 is initialized with (P−1)D modP (in contrast with initializing both counters with 0's for the interleaver process shown in FIG. 16. The addends to the left counter 1002 and middle counter 1004 are respectively ⌊nD/P⌋ and nD modP (in contrast with ⌊mD/P⌋ and mD modP associated with interleaver process shown in FIG. 16.

The present invention is not so limited however, and it shall be understood that it is easy to merge the interleaver/inverse-interleaver processes 900, 1000 into one single implementation for a (P,D,m) interleaver and its inverse. To do so, in addition to providing the flexibility of loading different addend values for the left and middle counters, flexibility is also needed in loading different initial values for these counters. Such an implementation with only simple adders and registers, works for arbitrary P,D,m,n as long as gcd (P,m)=1, gcd (P,1+mD)=1, and n=−m(1+mD)$^{-1}$modP.

In summary explanation, it was first noted that convolutional interleavers and triangular interleavers used in the ADSL/VDSL standards, as well as helical interleavers are all special cases of Forney's (P,D,m) modular periodic interleavers. It was shown that the number of memory locations needed to implement a periodic interleaver is lower bounded by its average delay A. An efficient way to generate the address sequence for the RAM implementation of Forney's (P,D,m) interleavers was described in association with the preferred embodiments. The number of memory locations required for this implementation is A+1+2P, which is close to the theoretical minimum.

The address generation circuit (with simple adders and registers) works for variable P,D,m. This is achieved by decomposing the (P,D,m) interleaver into a concatenation of a multiplexed interleaver (implemented with A+1 memory locations), followed by a block interleaver (implemented with 2P memory locations). In many applications, these 2P memory locations can be treated as part of the memory for controlling the data flow of the system. In the ADSL implementation described in "Asymmetric Digital Subscriber Line (ADSL) Transceivers," ITU-T Recommendation G.992.1, June 1999, for example, these 2P memory locations can be merged with the FIFO (First-In-First-Out) memory required for unpacking the fixed size symbols into variable size words required for the constellation encoder of the inner trellis code.

The address generation techniques described herein with reference to the figures apply to both interleavers and de-interleavers. Basically, one single circuit can be configured as an interleaver or its inverse.

In view of the above, it can be seen the present invention presents a significant advancement in the digital communication art. This invention has been described in considerable detail in order to provide those skilled in the art of Forney's modular periodic interleavers with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of generating an address sequence, the method comprising:
   decomposing a Forney's (P,D,m) interleaver with delays f(i)=(im mod P)D, 0≦i<P, into a concatenation of a multiplexed interleaver with period P and delays $f_M(i)$ =q(i)P, and a block interleaver with period P and delays $f_B(i)$=r(i)−i+P, wherein q(i) and r(i) are defined by i+f(i)=q(i)P+r(i), 0≦r(i)<P, and further wherein P is an arbitrary period, D is an arbitrary delay parameter and m is an integer greater than zero and less than P and that satisfies gcd (P,m)=1 and gcd (P,1+mD)=1;

generating A+1 multiplexed interleaver addresses, wherein A is the average delay of the (P,D,m) interleaver and equals (P−1)D/2;

generating 2P block interleaver addresses;

generating at least one two-dimensional address array from the multiplexed interleaver addresses and the block interleaver addresse; and controlling read and write addresses associated with a sole RAM in response to the at least one two-dimensional address array such that symbols are written into and read from the sole RAM according to a periodic sequence defined by the two-dimensional address array.

2. The method according to claim 1, wherein the 2P block interleaver addresses comprise read addresses and write addresses.

3. A method of generating an address sequence, the method comprising:

providing a first counter operational as an incrementer of mod P such that the first counter increments by 1 mod P on each successive time slot defined as i, wherein 0≦i<P;

initializing the first counter with 0;

providing a second counter operational as an incrementer of mod D such that the second counter increments by (⌊mD/P⌋+first carry) mod D on each successive time slot i, wherein first carry=0 if (f(i) mod P)+(mD mod P))<P and further wherein first carry=1 otherwise;

initializing the second counter with 0;

providing a third counter operational as an incrementer of mod P such that the third counter increments by (mD mod P) mod P on each successive time slot i;

initializing the third counter with 0;

adding the first and third counter counts to generate r(i)modP +second carry there from;

adding the second counter counts and the second carry counts to generate q(i) there from, wherein q(i) and r(i) are used in the representation of i+f(i)=q(i)P+r(i), 0≦r(i)<P, using the relationships r(i)mod P=((f(i)mod P)+i) mod P and q(i)=⌊f(i)/P⌋+second carry, wherein second carry=0 if (f(i)mod P)+i<P, and further wherein second carry=1 otherwise, and wherein P is an arbitrary period and D is an arbitrary delay parameter;

accumulating r(i) and time slot i, and generating a block interleaver write address sequence and a block interleaver read address sequence there from; and accumulating q(i)mod (A+1), wherein A is the average interleaver delay and is equal to (P−1)D/2, and generating a multiplexed interleaver address sequence there from, and further wherein m is an integer greater than zero and less than P (0<m<P) and satisfies gcd (P,m)=1 and gcd (P,1+mD)=1;

generating at least one two-dimensional address array from the multiplexed interleaver address sequence and the block interleaver address sequences; and controlling read and write addresses associated with a sole RAM in response to the at least one two-dimensional address array such that symbols are written into and read from the sole RAM according to a periodic sequence defined by the two-dimensional address array.

4. A method of generating an address sequence, the method comprising:

decomposing a Forney's (P,D,n) interleaver with delays f(i+1) mod P=(f(i)+nD) mod PD, 0≦i<P, into a concatenation of a multiplexed interleaver with period P and delays $f_M(i)$=q(i)P, and a block interleaver with period P and delays $f_B(i)$=r(i)−i+P, wherein q(i) and r(i) are defined by i+f(i)=q(i)P+r(i), 0≦r(i) <P, and further wherein P is an arbitrary period, D is an arbitrary delay parameter, m is an integer greater than zero and less than P (0<m<P) and satisfies gcd (P,m)=1 and gcd (P,1+mD)=1 and n=−m(1+mD)$_{-1}$ mod P;

generating A+1 multiplexed interleaver addresses, wherein A is the average delay of the (P,D,n) interleaver and equals (P−1)D/2;

generating 2P block interleaver addresses;

generating at least one two-dimensional address array from the multiplexed interleaver addresses and the block interleaver addresses; and controlling read and write addresses associated with a sole RAM in response to the at least one two-dimensional address array such that symbols are written into and read from the sole RAM according to a periodic sequence defined by the two-dimensional address array.

5. The method according to claim 4 wherein the 2P block interleaver addresses comprise read addresses and write addresses.

6. A method of generating an address sequence, the method comprising:

providing a first counter operational as an incrementer of mod P such that the first counter increments by 1 mod P on each successive time slot defined as i, wherein 0≦i<P, wherein P is an arbitrary period;

initializing the first counter with 0;

providing a second counter operational as an incrementer of mod D such that the second counter increments by (⌊nD/P⌋+first carry) mod D on each successive time slot i, wherein D is an arbitrary delay parameter, and further wherein first carry=0 if (f(i) mod P)+(nD mod P)<P and further wherein first carry=1 otherwise;

initializing the second counter with ⌊(P−1)D/P⌋;

providing a third counter operational as an incrementer of mod P such that the third counter increments by (nD mod P)mod P on each successive time slot;

initializing the third counter with (P−1)D mod P;

adding the first and third counter counts to generate r(i) and second carry there from, wherein second carry=0 if (f(i)mod P)+i<P, and further wherein second carry=1 otherwise;

adding the second counter counts and the second carry to generate q(i) there from, wherein q(i) and r(i) are used in the representation of i+f(i)=q(i)P+r(i), 0≦r(i)<P, using the relationships r(i)mod P=((f(i)mod P)+i)mod P and q(i) =⌊f(i)/P⌋+second carry;

accumulating r(i) and time slot i, and generating a block interleaver write address sequence and a block interleaver read address sequence there from; and accumulating q(i) mod (A+1), wherein A is the average interleaver delay and is equal to (P−1)D/2, and generating a multiplexed interleaver address sequence there from, wherein n=−m(1+mD)$_{-1}$ mod P, and further wherein m is an integer greater than zero and less than P (0<m<P) and satisfies god (P,m)=1 and god (P,1+mD)=1;

generating at least one two-dimensional address array from the multiplexed interleaver address sequence and the block interleaver address sequences; and controlling read and write addresses associated with a sole RAM in response to the at least one two-dimensional address array such that symbols are written into and read from the sole RAM according to a periodic sequence defined by the two-dimensional address array.

7. A method of generating an address sequence for a RAM implementation of Forney's (P,D,m) interleavers and their inverse (P,D,n) interleavers, the method comprising:

providing a first counter operational as an incrementer of mod P such that the first counter increments by 1 mod P on each successive time slot defined as i, wherein $0 \leq i < P$ wherein P is an arbitrary period;

initializing the first counter with 0;

providing a second counter operational as an incrementer of mod P such that the second counter increments by (nD mod P) mod P on each successive time slot i for the (P,D,n) interleaver, and such that the second counter increments by mD modD on each successive time slot for the (P,D,m) interleaver, wherein $n = -m(1+mD)_{-1}$ mod P, m is an integer greater than zero and less than P ($0 < m < P$) and satisfies god (P,m)=1 and god (P,1+mD)=1, and D is an arbitrary delay parameter;

initializing the second counter with (P−1)D mod P for the (P,D,n) interleaver, and with 0 for the (P,D,m) interleaver;

providing a third counter operational as an incrementer of mod D such that the third counter increments by ($\lfloor nD/P \rfloor$+first carry) mod D, for the (P,D,n) interleaver, wherein first carry is zero if and only if (f(i)mod P)+(nD mod P)<P, and is equal to one otherwise, and further such that the third counter increments by ($\lfloor mD/P \rfloor$+first carry) mod D for the (P,D,m) interleaver, wherein first carry is zero if and only if (f(i)mod P)+(mD mod P)<P, and is equal to one otherwise;

initializing the third counter with $\lfloor (P-1)D/P \rfloor$ for the (P,D,n) interleaver and with 0 for the (P,D,m) interleaver;

adding the first and second counter counts to generate r(i) and second carry there from, wherein second carry=0 if (f(i)mod P)+i<P, and further wherein second carry =1 otherwise;

adding the third counter counts and the second carry counts to generate q(i) there from;

accumulating r(i) and time slot i, and generating a block interleaver write address sequence and a block interleaver read address sequence there from ;

accumulating q(i)mod (A+1), wherein A is the average interleaver delay and is equal to (P−1)D/2, and generating a multiplexed interleaver address sequence there from;

generating at least one two-dimensional address array from the multiplexed interleaver address sequence and the block interleaver address sequences; and controlling read and write addresses associated with a sole RAM in response to the at least one two-dimensional address array such that symbols are written into and read from the sole RAM according to a periodic sequence defined by the two-dimensional address array.

8. An address sequence generator that implements of Forney's (P,D,M) interleavers, the address sequence generator comprising:

an address generation circuit that concatenates of a multiplexed interleaver with period P and delays $f_M(i) = q(i)P$, and a block interleaver with period P and delays $f_B(i) = r(i) - i + P$, wherein q(i) and r(i) are defined by $i + f(i) = q(i)P + r(i)$, for $0 \leq r(i) < P$, and further wherein P is an arbitrary period, D is an arbitrary delay parameter and m is an integer greater than zero and less than P and that satisfies gcd (P,m)=1 and gcd (P,I+mD)=1, and further wherein the Forney's (P,D,m) interleaver has delays f(i)=(im mod P)D, $0 \leq i < P$;

a solo RAM that stores symbols; and an address controller that controls read and write addresses associated with the sole RAM in response to the at least one two-dimensional address array such that symbols are written into and read from the sole RAM according to a periodic sequence defined by the two-dimensional address array.

9. An address sequence generator for a RAM implementation of Forney's (P,D,m) interleavers and their inverse (P,D,n) interleavers, the address sequence generator comprising:

first counting means for incrementing from 0 by 1 mod P on each successive time slot defined as i, wherein $0 \leq i < P$, wherein P is an arbitrary period;

second counting means for incrementing from (P−1)D mod P by (nD mod P) mod P on each successive time slot i for the (P,D,n) interleaver, and from 0 by (mD mod P) mod P on each successive time slot i for the (P,D,m) interleaver, wherein D is an arbitrary delay parameter, m is an integer greater than zero and less than P ($0 < m < P$) and satisfies gcd (P,m)=1 and gcd (P,1+mD)=1, and $n = -m(1+mD)_{-1}$ mod P;

third counting means for incrementing from $\lfloor (P-1)D/P \rfloor$ by ($\lfloor nD/P \rfloor$+first carry) mod D,for the (P,D,n) interleaver, wherein first carry is zero if and only if (f(i)mod P)+(nD mod P)<P, and is equal to one otherwise, and from 0 by ($\lfloor mD/P \rfloor$+first carry) mod D, for the (P,D,m) interleaver, wherein first carry is zero if and only if (f(i)mod P)+(mD mod P)<P, and is equal to one otherwise;

means for adding the first means counts and the second means counts to generate r(i) and second carry counts there from;

means for adding the third means counts and the second carry counts to generate q(i) there from, wherein q(i) and r(i) are used in the representation of i+f(i)=q(i)P+r(i), $0 \leq r(i) < P$, using the relationships r(i)mod P=((f(i) mod P)+i)mod P and q(i)=$\lfloor f(i)/P \rfloor$+second carry, wherein second carry=0 if (f(i)mod P)+1<P, and further wherein second carry=1 otherwise,;

means for accumulating r(i) and time slot i, and generating a block interleaver write address sequence and a block interleaver read address sequence there from; and means for accumulating q(i)mod (A+1), wherein A is the average interleaver delay and is equal to (P−1)D/2, and generating a multiplexed interleaver address sequence there from; and means for storing symbols such that the symbols are written to and read from the means for storing the symbols according to a periodic sequence defined by the block interleaver address sequences and the multiplexed interleaver address sequence.

10. The address sequence generator according to claim 9, wherein the means for storing symbols comprises a sole RAM.

11. A data structure stored in a RAM for controlling a data flow in a digital communication system, said data structure generated by a process comprising:

decomposing a Fomey's (P,D,M) interleaver with delays f(i)=(im mod P)D, $0 \leq i < P$, into a concatenation of a multiplexed interleaver with period P and delays $f_M(i) = q(i)P$, and a block interleaver with period P and delays $f_B(i) = r(i) - i + P$, wherein q(i) and r(i) are defined by $i+f(i)=q(i)P+r(i)$, $0 \leq (i)<P$, and further wherein P is an arbitrary period, D is an arbitrary delay parameter and m is an integer greater than zero and less than P and that satisfies gcd $(P,m)=1$ and gcd $(P,I+mD)=1$;

generating A+I multiplexed interleaver addresses, wherein A is the average delay of the (P,D,m) interleaver and equals $(P-1)D/2$;

generating 2P block interleaver addresses;

generating at least one two-dimensional address array from the multiplexed interleaver addresses and the block interleaver addresses.

* * * * *